United States Patent
Han et al.

(10) Patent No.: US 12,441,911 B2
(45) Date of Patent: Oct. 14, 2025

(54) COMPOSITION FOR SEMICONDUCTOR PROCESSING AND POLISHING METHOD OF SEMICONDUCTOR DEVICE USING THE SAME

(71) Applicant: SK enpulse Co., Ltd., Pyeongtaek-si (KR)

(72) Inventors: Deok Su Han, Seoul (KR); Seung Chul Hong, Seoul (KR); Han Teo Park, Seoul (KR); Hwan Chul Kim, Seoul (KR); Hyeong Ju Lee, Seoul (KR)

(73) Assignee: SK enpulse Co., Ltd., Pyeongtaek-si (KR)

( * ) Notice: Subject to any disclaimer, the term of this patent is extended or adjusted under 35 U.S.C. 154(b) by 249 days.

(21) Appl. No.: 18/297,152

(22) Filed: Apr. 7, 2023

(65) Prior Publication Data

US 2023/0332016 A1   Oct. 19, 2023

(30) Foreign Application Priority Data

Apr. 13, 2022   (KR) .......................... 10-2022-0045762

(51) Int. Cl.
  *C09G 1/02* (2006.01)
  *C09K 3/14* (2006.01)
  *H01L 21/306* (2006.01)

(52) U.S. Cl.
  CPC .............. *C09G 1/02* (2013.01); *C09K 3/1436* (2013.01); *H01L 21/30625* (2013.01)

(58) Field of Classification Search
  None
  See application file for complete search history.

(56) References Cited

U.S. PATENT DOCUMENTS

| | | | |
|---|---|---|---|
| 2004/0229461 A1 | 11/2004 | Darsillo et al. | |
| 2018/0111248 A1* | 4/2018 | Mitsumoto | ........... H01L 21/304 |
| 2020/0024515 A1 | 1/2020 | Lu et al. | |

FOREIGN PATENT DOCUMENTS

| | | |
|---|---|---|
| CN | 102766406 A | 11/2012 |
| CN | 103080256 A | 5/2013 |
| CN | 110114856 A | 8/2019 |
| CN | 110734703 A | 1/2020 |
| CN | 113440428 A | 9/2021 |
| EP | 3 597 711 A1 | 1/2020 |
| JP | 2006-179845 A | 7/2006 |
| KR | 10-2006-0059216 A | 6/2006 |
| KR | 10-2008-0069537 A | 7/2008 |

(Continued)

OTHER PUBLICATIONS

Chinese Office Action Issued on Jun. 18, 2025, in Counterpart Chinese Patent Application No. 202310384135.1 (4 Pages in English, 5 Pages in Chinese).

*Primary Examiner* — Roberts P Culbert
(74) *Attorney, Agent, or Firm* — NSIP Law

(57) ABSTRACT

A composition for semiconductor processing, includes abrasive particles surface-modified with an amino silane-based compound; a copper erosion inhibitor, including an azole-based compound; a copper surface protectant, including a compound having a betaine group and a salicylic group or a derivative thereof; and a surfactant, including fluorine in a molecule thereof. A surface of the surface-modified abrasive particles comprises an amino silane group.

16 Claims, 3 Drawing Sheets

(56) References Cited

FOREIGN PATENT DOCUMENTS

| | | |
|---|---:|---:|
| KR | 10-1330956 B1 | 11/2013 |
| KR | 10-1526006 B1 | 6/2015 |
| KR | 10-1844801 B1 | 4/2018 |
| KR | 10-2018-0073131 A | 7/2018 |
| KR | 10-2261822 B1 | 6/2021 |
| TW | 200409808 A | 6/2004 |
| TW | 200634119 A | 10/2006 |

* cited by examiner

COMPOSITION FOR SEMICONDUCTOR PROCESSING AND POLISHING METHOD OF SEMICONDUCTOR DEVICE USING THE SAME

CROSS-REFERENCE TO RELATED APPLICATION

This application claims the benefit under 35 USC 119(a) of Korean Patent Application No. 10-2022-0045762, filed on Apr. 13, 2022, the entire disclosure of which is incorporated herein by reference for all purposes.

BACKGROUND

1. Field

The following description relates to a composition for semiconductor processing and polishing method of semiconductor device using the same.

2. Discussion of Related Art

During semiconductor manufacturing, a CMP process is used to flatten a wafer surface using a polishing pad and a slurry composition. The CMP process polishes the wafer surface using a slurry composition, including an abrasive, while performing an orbital motion in which rotational and linear motions are combined after the polishing pad is in contact with the wafer.

The slurry composition used in the CMP process is mainly composed of abrasive particles with a physical action and a compound such as an etchant with a chemical action. Therefore, the slurry composition performs a more optimized and extensive planarization process by selectively etching an exposed portion of the wafer surface through physical and chemical actions.

In polishing copper wiring, it is desirable to control the polishing rate for different types of films.

In polishing the copper wiring, a polishing target includes the copper wiring directly, a barrier film, and an insulating film (a passivation layer). At this time, the polishing performance also varies depending on the difference between the polishing rate for copper and the polishing rate for the other two films.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a composition for semiconductor processing, includes abrasive particles surface-modified with an amino silane-based compound; a copper erosion inhibitor, including an azole-based compound; a copper surface protectant, including a compound having a betaine group and a salicylic group or a derivative thereof; and a surfactant, including fluorine in a molecule thereof. A surface of the surface-modified abrasive particles comprises an amino silane group.

The azole-based compound and the copper surface protectant may be included in the composition in a weight ratio of 1:0.2 to 4.

The azole-based compound and the surfactant may be included in the composition in a weight ratio of 1:0.001 to 0.2.

The azole-based compound may be included in the composition at 0.02 to 2 parts by weight based on 100 parts by weight of the abrasive particles.

The amino silane-based compound and the azole-based compound may be included in the composition in a weight ratio of 1:0.1 to 0.28.

The composition may include a range between 1% to 17% by weight of the abrasive particles.

The composition may be a slurry for polishing a surface comprising copper, silicon nitride, and silicon oxide.

A surface of a circular via with a diameter of 5 μm, polished with the composition, may have a maximum roughness of 220 nm or less as measured by atomic-force microscopy (AFM).

In another general aspect, a composition for semiconductor processing, includes abrasive particles surface-modified with an amino silane-based compound; a copper erosion inhibitor, including an azole-based compound; a copper surface protectant, including a compound having a betaine group and a salicylic group or a derivative thereof; and a surfactant, including fluorine in a molecule thereof. A copper corrosion inhibition index (Er) for the composition according to Equation 1 below is 8 to 15;

$$Er = \frac{indexC \times Cab}{Ps}, \quad \text{[Equation 1]}$$

where indexC is a value according to Equation 2 below, Cab is a content (wt %) of the abrasive particles contained in an entire composition for the semiconductor processing, and Ps is parts by weight of the amino silane-based compound applied to 100 parts by weight of the abrasive particles, $$IndexC = C1 \times 6 + C2 \times 5 - C3 - C4 \times 10, \quad \text{[Equation 2]}$$

where C1 is a content (parts by weight) of the amino silane-based compound applied to the abrasive particles contained in a total of 100 parts by weight of the composition, C2 is a content (parts by weight) of the azole-based compound contained in a total of 100 parts by weight of the composition, C3 is a content (parts by weight) of the copper surface protectant contained in a total of 100 parts by weight of the composition, and C4 is a content of the surfactant contained in a total of 100 parts by weight of the composition.

The composition may further include a silicon nitride polishing enhancer, wherein the indexC is a value according to Equation 2-1 below;

$$IndexC = C1 \times 6 + C2 \times 5 - C3 - C4 \times 10 - C5 \times 2, \quad \text{[Equation 2-1]}$$

where C1 is a content (parts by weight) of the amino silane-based compound applied to the abrasive particles contained in a total of 100 parts by weight of the composition, C2 is a content (parts by weight) of the azole-based compound contained in a total of 100 parts by weight of the composition, C3 is a content (parts by weight) of the copper surface protectant contained in a total of 100 parts by weight of the composition, C4 is a content of the surfactant contained in a total of 100 parts by weight of the composition, and C5 is a content of the silicon nitride polishing enhancer contained in a total of 100 parts by weight of the composition.

A surface area difference between an actual surface area and a projected surface area of a circular copper via, having a diameter of 5 μm, polished with the composition may be less than 2.5% as measured by AFM.

The composition may be used to polish a substrate by rotating either one or both of a platen on which a polishing pad is mounted and a carrier accommodating the substrate to planarize a surface of the substrate.

In another general aspect, a method of polishing a substrate, includes polishing a substrate by rotating either one or both of a platen on which a polishing pad is mounted and a carrier accommodating a substrate to planarize a surface of the substrate. The polishing is performed with a composition including abrasive particles surface-modified with an amino silane-based compound; a copper erosion inhibitor, including an azole-based compound; a copper surface protectant, including a compound having a betaine group and a salicylic group or a derivative thereof; and a surfactant, including fluorine in a molecule thereof. A surface of the surface-modified abrasive particles comprises an amino silane group, and the surface of the substrate includes each of copper, silicon nitride, and silicon oxide.

An absolute value of skewness of a circular copper via having a diameter of 5 μm on the surface of the substrate subjected to the polishing may be 1 or less as measured by surface atomic-force microscopy (AFM).

A SiO/SiN selectivity, a ratio of a silicon oxide polishing rate to a silicon nitride polishing rate, may be 3 or more.

A SiO/Cu selectivity, a ratio of a silicon oxide polishing rate to a copper polishing rate, may be 0.9 or more.

Other features and aspects will be apparent from the following detailed description, the drawings, and the claims.

BRIEF DESCRIPTION OF THE DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
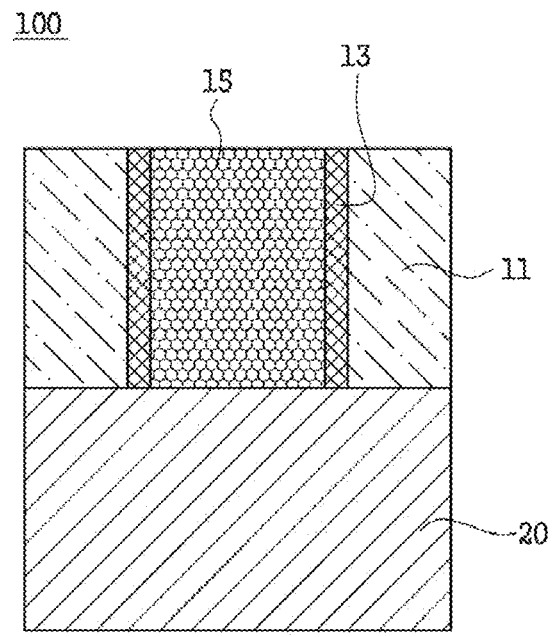
FIG. 1 is a conceptual diagram illustrating an example of a cross-section of a substrate, including a through via planarized by a composition for semiconductor processing.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

In this specification, the term "combination thereof" included in the expression of the Markush form means a mixture or combination of one or more selected from the group consisting of the components described in the expression of the Markush form, and it means including one or more selected from the group consisting of the above components.

A composition for semiconductor processing, according to an embodiment, includes abrasive particles surface-modified with an amino silane-based compound; a copper erosion inhibitor including an azole-based compound; a copper surface protectant including a compound having a betaine group and a salicylic group or a derivative thereof; and a surfactant including fluorine in a molecule.

The surface-modified abrasive particle has an amino silane group on its surface.

Hereinafter, an embodiment will be described in more detail.

Abrasive Particles

Abrasive particles mainly perform a physical etching action and may perform a planarization action through mechanical friction with a surface of an object to be polished.

The abrasive particles may include inorganic particles, organic particles, or organic and inorganic composite particles.

The inorganic particles may include inorganic particles surface-modified with organic material. Inorganic particles should be understood as a concept encompassing a trace amount of organic components. At this time, the trace amount means a content of about 0.03 parts by weight or less based on a total of 100 parts by weight of the abrasive particles. The organic and inorganic composite particles include 50 to 200 parts by weight of organic components based on 100 parts by weight of the inorganic components.

The inorganic particle may include, for example, one metal oxide particle selected from the group consisting of silica ($SiO_2$), ceria ($CeO_2$), alumina ($Al_2O_3$), zirconia ($ZrO_2$), and combinations thereof.

The abrasive particles may be in a colloidal state. For example, the abrasive particles may include colloidal inorganic particles.

The abrasive particles may be metal oxide particles having a functional group-exposed surface.

The surface may include a functional group, including an amine group at a terminal.

The functional group, including the amine group at the terminal, may be introduced into the surface of the abrasive particle by surface-modifying the abrasive particle with a silane compound.

The silane compound may be, for example, amino silane, ureido silane, and combinations thereof, and may be amino silane. The amino silane may be any one selected from the group consisting of, for example, 3-aminopropyltriethoxysilane, bis[(3-triethoxysilyl)propyl]amine, 3-aminopropyltrimethoxysilane, bis[(3-trimethoxysilyl)propyl]amine, 3-aminopropylmethyldiethoxysilane, 3-aminopropylmethyldimethoxysilane, N-[3-(trimethoxysilyl)propyl]ethylenediamine, N-bis[3-(trimethoxysilyl)propyl]-1,2-ethylenediamine, N-[3-(triethoxysilyl)propyl]ethylenediamine, diethylenetriaminopropyltrimethoxysilane, diethylenetriaminopropylmethyldimethoxysilane, diethylaminomethyltriethoxysilane, diethylaminopropyltrimethoxysilane, diethylaminopropyltriethoxysilane, dimethylaminopropyltrimethoxysilane, N-[3-(trimethoxysilyl)propyl]butylamine, and combinations thereof. The ureido silane may be any one selected from the group consisting of 3-ureidotrimethoxysilane, 3-ureidotriethoxysilane, and combinations thereof.

The silane compound may be applied in 0.05 to 10 parts by weight based on 100 parts by weight of the metal oxide particles. The silane compound may be applied in 0.1 to 5 parts by weight based on 100 parts by weight of the metal oxide particles. The silane compound may be applied in 0.1 to 3 parts by weight based on 100 parts by weight of the metal oxide particles. In this case, the intended modification of the surface of the metal oxide particle can sufficiently proceed. In addition, the silane compound can be applied together with other components to maintain the abrasive particle's polishing rate and quality at a desired level.

The amino silane-based compound may be applied in 0.01 to 70 parts by weight or 0.01 to 30 parts by weight based on 1 part by weight of the azole-based compound described below. The amino silane-based compound may be applied in 0.1 parts by weight to 0.28 parts by weight based on 1 part by weight of the azole-based compound described below. In this case, there is an advantage in that an excellent etching effect can be obtained while applying a minimum amount of surface treatment agent.

The abrasive particle may have a diameter ($D_{50}$) of 10 nm to 120 nm. The abrasive particle may have a diameter ($D_{50}$) of 15 nm to 90 nm. The abrasive particle may have a diameter ($D_{50}$) of 20 nm to 60 nm. When the diameter ($D_{50}$) of the abrasive particle exceeds 120 nm, the possibility of generating defects such as scratches on a substrate to be polished may increase. When the diameter is less than 10 nm, the dispersibility of the particles may deteriorate, or the occurrence of defects may rather increase. When the diameter is 20 nm to 60 nm, excellent physical properties can be obtained when applied as the composition for semiconductor processing of a substrate having a fine wiring width.

The diameters mentioned above are based on Malvern's Nano-ZS equipment, which measures the size of the particle by dynamic light scattering (DLS).

The abrasive particle may have a zeta potential of +1 mV to +80 mV, +2 mV to +50 mV, or +20 mV to +40 mV. When inorganic or organic particles do not have a zeta potential within the above range, those treated to have the above zeta potential through surface modification may be applied.

The method of measuring the zeta potential of the abrasive particle is not particularly limited, but, for example, the potential may be measured after about 1 mL of the abrasive particles are injected into a cell for measurement using zeta potential measuring equipment (Malvern Co., Zeta-sizer Nano ZS).

The abrasive particle may have a zeta potential within the above range by modifying the surface of a colloidal silica particle with amino silane.

The abrasive particle may be included in an amount of 1% by weight or more, 3% by weight or more, or 4% by weight or more based on the total weight of the composition for semiconductor processing. The abrasive particle may be included in an amount of 8% by weight or less or 7% by weight or less based on the total weight of the composition for semiconductor processing.

When the composition for semiconductor processing includes abrasive particles within the range described above, a more efficient polishing process can be operated.

Copper Erosion Inhibitor

The copper erosion inhibitor includes an azole-based compound.

Examples of the azole-based compound may include one selected from the group consisting of benzotriazole (BTA), 5-methyl-1H-benzotriazole (5-MBTA), 3-amino-1,2,4-triazole, 5-phenyl-1H-tetrazole, 3-amino-5-methyl-4H-1,2,4-triazole, 5-aminotetrazole (ATZ), 1,2,4-triazole, tolyltriazole, and combinations thereof.

Examples of the azole-based compound may include one selected from the group consisting of 5-aminotetrazole (ATZ), 5-methyl-1H-benzotriazole (5-MBTA), and combinations thereof The azole-based compound can act on a copper surface during polishing to prevent copper erosion.

The azole-based compound may be included in 0.02 to 2.00 parts by weight, 0.03 to 1.5 parts by weight, or 0.5 to 1.5 parts by weight based on 100 parts by weight of the abrasive particles.

When the azole-based compound is included within the above range, it is possible to obtain an anti-erosion effect on the copper surface of the composition for semiconductors, and in particular, it is possible to provide a strong anti-erosion effect to a relatively wide surface such as a surface of a via hole.

Copper Surface Protectant

The copper surface protectant may be a compound having a betaine group and a salicylic group or a derivative thereof.

The copper surface protectant may include betaine salicylate.

The copper surface protectant may include any one selected from the group consisting of betaine hydrochloride, betaine perchloric acid, betaine aldehyde chloride, and combinations thereof, and/or salicylic acid.

The copper surface protectant effectively protects the copper surface during a polishing process, and thus can substantially suppress the occurrence of dishing due to polishing on the surface of the via, in which relatively soft copper is exposed relatively widely.

The copper surface protectant may be included in 0.1 to 1.5 parts by weight or 0.13 to 0.42 parts by weight based on 100 parts by weight of the abrasive particles.

The copper surface protectant may be present as ions in an aqueous solution, and the copper surface protectant's content and/or content ratio may be confirmed by removing pure water as a solvent.

The composition for semiconductor processing may include the copper surface protectant in a weight ratio of 0.2 to 4, in a weight ratio of 0.2 to 2.5, in a weight ratio of 0.4 to 2.0, in a weight ratio of 0.4 to 1.0, or in a weight ratio of 0.4 to 0.6 based on an azole-based compound content of 1.

The azole-based compound has a strong copper surface erosion inhibiting effect, and the copper surface protectant has a relatively weak copper surface erosion inhibiting effect, respectively. Copper surface protectants comprising these components may control excessive erosion or dishing on the copper surface so that excellent polishing quality can be imparted even when polishing is performed at high speed.

Surfactant

The composition for semiconductor processing includes a surfactant, including fluorine, in a molecule thereof.

Examples of the surfactant include fluorine, BNO-BS-BOH from BNO Chem., FS-30, FS-31, FS-34, ET-3015, ET-3150, ET-3050, and Capstone FS-3100 from the Chemours Company, and the like, may be applied alone or in combination.

The surfactant, including fluorine, can effectively prevent excessive adsorption of abrasive particles to a surface of an object to be polished. In addition, it is possible to change or maintain a surface to be planarized, such as a silicon oxide film, in a state favorable for polishing.

The surfactant, including fluorine, may be included in the composition for semiconductor processing at 0.003 parts by weight to 0.05 parts by weight, 0.005 parts by weight to 0.03 parts by weight, or 0.007 parts by weight to 0.02 parts by weight based on 100 parts by weight of the abrasive particles. When the surfactant, including fluorine, is included within the above range, reducing a defect phenomenon caused by excessive adsorption of abrasive particles to the surface of an object to be polished can be obtained.

The composition for semiconductor processing may include the surfactant, including fluorine in a weight ratio of 0.001 to 0.2, a weight ratio of 0.013 to 1.5, or a weight ratio of 0.015 to 0.05 based on an azole-based compound content of 1. When applied at such a content ratio, it is possible to substantially suppress the generation of adhesive foreign matter by interacting the surfactant with other components while suppressing the generation of defects due to the surface adsorption of particles generated during the polishing process.

Silicon Nitride Polishing Enhancer

The composition for semiconductor processing may further include a silicon nitride polishing enhancer.

The silicon nitride polishing enhancer may include a phosphoric acid-based compound. The phosphoric acid-based compound may help to adjust the polishing properties of a barrier film, such as a silicon nitride film.

The phosphoric acid-based compound may be one selected from the group consisting of, for example, phosphomolybdic acid or a salt thereof, nitrilotris(methylenephosphonic acid) or a salt thereof, phosphorus trichloride or a salt thereof, pyrophosphate or a salt thereof, and combinations thereof. The salt may be a sodium salt, a potassium salt, and the like.

The phosphoric acid-based compound may include nitrilotris(methylenephosphonic acid) and/or potassium pyrophosphate.

The composition for semiconductor processing may include 0 to 0.005 parts by weight, 0 to 0.004 parts by weight, or 0 to 0.003 parts by weight of the phosphoric acid-based compound based on 100 parts by weight of the abrasive particles.

The composition for semiconductor processing may include 0.001 or less of the phosphoric acid-based compound based on 100 parts by weight of the abrasive particles, or may not substantially include the phosphoric acid-based compound.

The composition for semiconductor processing may include 0 to 0.05 parts by weight, 0 to 0.01 parts by weight, or 0 to 0.003 parts by weight of the phosphoric acid-based compound based on 1 part by weight of the azole-based compound.

When the phosphoric acid-based compound is further applied to the composition for semiconductor processing, it may help to adjust the polishing properties of a barrier film such as a silicon nitride film.

Other Additives

The composition for semiconductor processing may include an organic acid as an additive.

The organic acid may mainly serve as a chelator, and specifically, copper ions and hydroxyl groups of the organic acid may be bonded to each other to trap the copper ions and improve polishing efficiency.

For example, the organic acid may include one selected from the group consisting of acetic acid, formic acid, benzoic acid, nicotinic acid, picolinic acid, alanine, phenylalanine, valine, leucine, isoleucine, arginine, aspartic acid, citric acid, adipic acid, succinic acid, oxalic acid, glycine, glutamic acid, glutaric acid, phthalic acid, histidine, threonine, serine, cysteine, methionine, asparagine, tyrosine, diiodotyrosine, tryptophan, proline, oxyproline, ethylenediaminetetraacetic acid (EDTA), nitrilotriacetic acid (NTA), iminodiacetic acid (IDA), and combinations thereof.

The composition for semiconductor processing may include citric acid as the organic acid.

In the composition for semiconductor processing, an acid component may be added to the above components to prepare and maintain a solution in an appropriate pH range. The acid component may be applied to the composition for semiconductor processing together with a pH adjusting agent.

As the acid component, one or two or more of hydrochloric acid (HCl), phosphoric acid ($H_3PO_4$), sulfuric acid ($H_2SO_4$), nitric acid ($HNO_3$), and the like may be used. As the pH adjusting agent, one or two or more of ammonium hydroxide ($NH_4OH$), potassium hydroxide (KOH), sodium hydroxide (NaOH), and the like may be used.

The acid component and the pH adjusting agent may be applied in an appropriate amount according to the intended pH.

The composition for semiconductor processing may further include a non-ionic polymer.

The non-ionic polymer may be at least one selected from the group consisting of polyethylene glycol, polypropylene glycol, polyvinylpyrrolidone, polyethylene oxide, polypropylene oxide, polyalkyl oxide, polyoxyethylene oxide, a polyethylene oxide-propylene oxide copolymer, cellulose, methyl cellulose, methyl hydroxyethyl cellulose, methyl hydroxypropyl cellulose, hydroxyethyl cellulose, carboxymethyl cellulose, carboxymethyl hydroxyethyl cellulose, sulfoethyl cellulose, and carboxymethyl sulfoethyl cellulose.

Non-ionic polymers with an average molecular weight of less than 25,000 g/mol may be applied. When the weight average molecular weight of the non-ionic polymer is less than 25,000 g/mol, the non-ionic polymer may have excellent solubility and dispersibility. A non-ionic polymer with an average molecular weight of 1,000 g/mol or more and less than 25,000 g/mol may be applied. When the non-ionic polymer in the above range is applied, the composition for semiconductor processing may have better solubility and dispersion stability and advantageous polishing properties.

The semiconductor processing composition may include an additional chelator compound separately from or together with the organic acid. The chelator adsorbs a metal or metal ion to facilitate the metal or metal ion's removal.

Illustratively, the chelator may include two or more carboxyl groups or alcohol groups in a molecule thereof. As the chelator, two or more types of those, including two or more carboxyl groups or alcohol groups in the molecule thereof, may be used. Specifically, the chelator may include any one selected from the group consisting of ethylenediaminetetraacetic acid (EDTA), glycine, carboxylic acids, and combinations thereof. The carboxylic acids refer to a compound including at least one or two or more carboxyl groups in a molecule thereof.

The composition for semiconductor processing further includes a solvent.

The composition for semiconductor processing may be an aqueous dispersion solution.

The aqueous dispersion solution means that pure water is applied as a main solvent, and includes a case in which some liquid organic materials or some organic solvents are included.

Composition for Semiconductor Processing

The polishing composition for semiconductor processing may be an acidic solution.

Specifically, the pH of the polishing composition for semiconductor processing may be 2 to 5. The pH of the polishing composition for semiconductor processing may be 2 to 4.5, or 2 to 4. When an acidic environment of the composition is maintained within the above range, it is possible to maintain the polishing rate and quality above a certain level while preventing excessive erosion of metal components or polishing devices.

Since copper is relatively soft and silicon oxide and silicon nitride are relatively hard, it is not easy to quickly and evenly polish the surface on which they are simultaneously exposed.

The composition for semiconductor processing may be applied as a slurry for polishing a surface partially, including copper, silicon nitride, and silicon oxide, to obtain an excellent polishing effect.

Even when the composition for semiconductor processing is polished at a relatively high polishing rate, defects such as erosion or dishing may not occur in parts having soft properties, such as copper.

Specifically, the composition for semiconductor processing is advantageous for application to a polishing process of a substrate such as a semiconductor wafer, including a through via.

Figure 2:
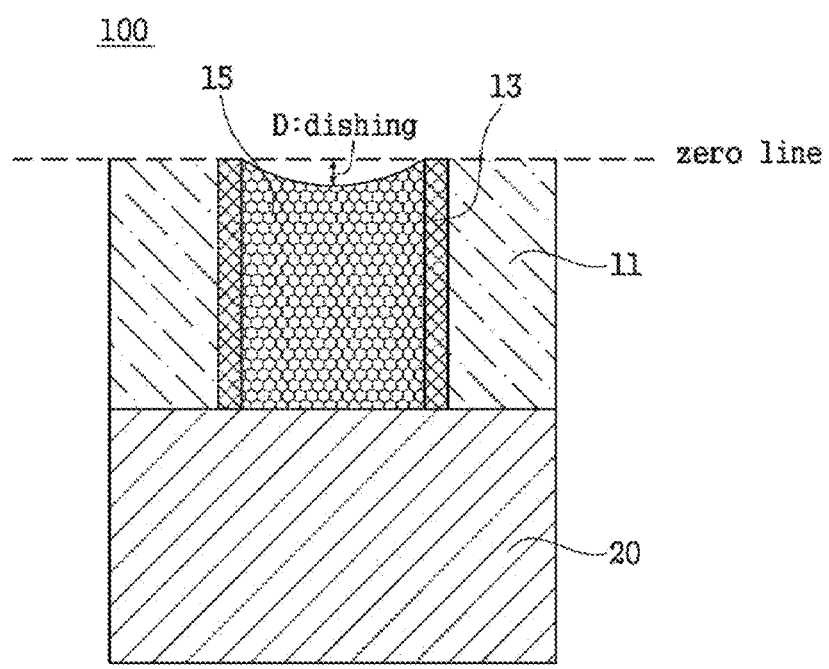
FIG. 2 is a conceptual diagram illustrating an example of dishing using a cross-section of the substrate.
Figure 3:
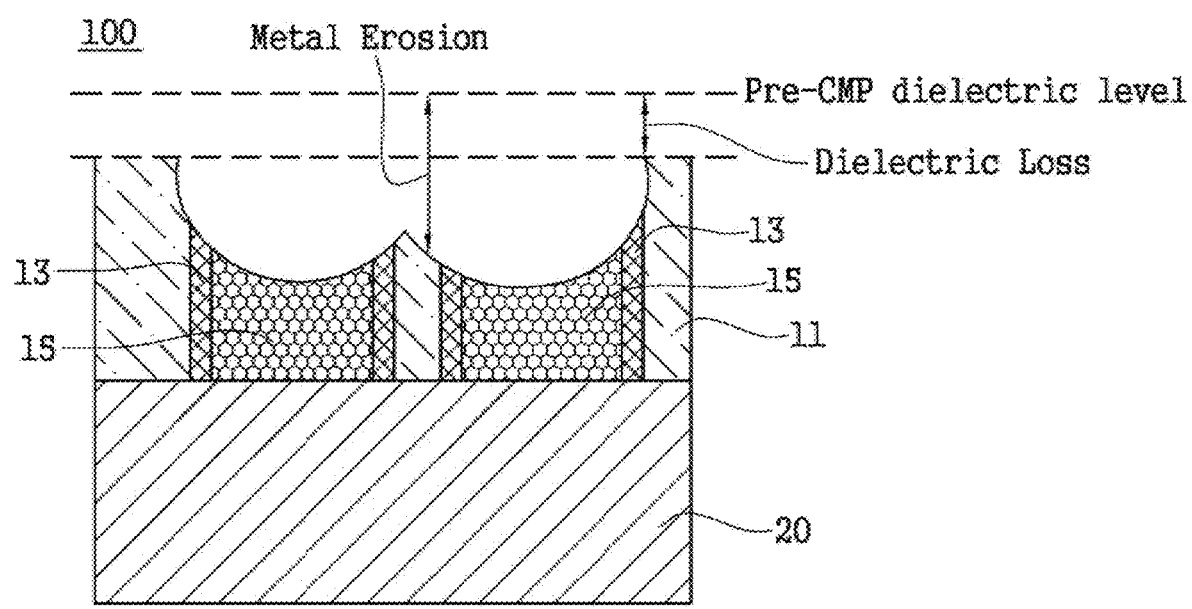
FIG. 3 is a conceptual diagram illustrating an example of metal erosion using a cross-section of the substrate.

FIG. 1 is a conceptual diagram illustrating a cross-section of a substrate (including a through via) planarized by the composition for semiconductor processing, FIG. 2 is a conceptual diagram illustrating dishing using a cross-section of the substrate, and FIG. 3 is a conceptual diagram illustrating metal erosion using a cross-section of the substrate. Referring to FIGS. 1 to 3, the present disclosure will be described in more detail.

A substrate 100 including a through via includes an insulating film material such as $SiO_2$ that functions as an insulating film 11, a barrier film material such as SiN that functions as a barrier film 13 that prevents the movement of metal ions, and a conductive film material such as copper applied as a conductive film 15 that has electrical conductivity and transmits an electrical signal.

In a planarization process of the substrate, a surface on which two or three types of films having different properties are simultaneously exposed is planarized. Since different films have different properties (strength, degree of oxidation, etc.), it is not easy to planarize the films simultaneously and quickly.

Semiconductor substrates are being miniaturized and becoming more complex, such as the manufacture of conductive wires in the form of fine lines and the frequent use of through vias. Because of this, a more rigorous planarization process may be desired along with process efficiency. Through vias have a larger exposed area than fine lines and are composed of a metal that is softer than metal oxides or metal nitrides, so defects such as dishing (see FIG. 2) or metal erosion (see FIG. 3) are more likely to occur.

When excessive dishing or erosion occurs in a through via portion, an incomplete electrical connection occurs in a vertical direction, and thus it is difficult to transmit sufficient electrical signals, which can cause fatal defects in semiconductors.

The composition for semiconductor processing of an embodiment substantially suppresses the corrosion of a conductive film, such as copper, while applying an efficient polishing process.

Polishing conditions) slurry flow rate: 300 ml/min, carrier speed: 120 rpm, platen speed: 117 rpm, pressurization: 3.0 psi down pressure, polishing equipment: CTS's 300 mm CMP equipment, and polishing pad: SKC Solmics' HD-500 model polishing pad.

A surface of a circular via having a diameter of 5 μm, which is polished with the composition for semiconductor processing, may have a Rmax roughness of 220 nm or less, 200 nm or less, 180 nm or less, or 160 nm or less, as measured by atomic-force microscopy (AFM). The Rmax roughness may be 100 nm or more. The Rmax means a maximum height roughness and is a variable different from Ra, which means a center line average roughness. The Rmax is a sum of a maximum peak height and a maximum valley depth within a measurement range. The Rmax roughness value means that the occurrence of corrosion is substantially reduced.

The surface of a circular via having a diameter of 5 μm, which is polished with the composition for semiconductor processing, may have a surface area difference of less than 2.5%, 2.3% or less, 2.2% or less, 2% or less, or 1.8% or less, as measured by AFM. The surface area difference may be 1% or more. The surface area difference is also expressed as Sdr, and means a difference between an actual surface area and a projected surface area. The surface area difference can be used as one of the indicators of surface complexity, expressed as a percentage, and referred to as the surface area difference percentage. Having such a low surface area difference means that the complexity of the surface is significantly lower, i.e., it has a flatter surface.

The surface of a circular via having a diameter of 5 μm, which is polished with the composition for semiconductor processing, may have an absolute value of skewness of 1 or less, 0.96 or less, 0.8 or less, or 0.6 or less, as measured by AFM. The absolute value of the skewness may be greater than or equal to 0.2. When the absolute value of the skewness is small, it means that the asymmetry of the surface is relatively insignificant, and considering that it is a polished surface of the circular via, a surface having such a skewness property may have a flatter property.

A surface of a circular via having a diameter of 5 μm, which is polished with the composition for semiconductor processing, may have a Z range of 220 nm or less, 200 nm or less, 180 nm or less, or 160 nm or less, as measured by AFM. The Z range may be 100 nm or more. The Z range is one of the variables derived from AFM measurement. With such a Z range, it can be shown that the surface is flatter.

Variables such as roughness may be calculated by measuring a surface profile with AFM equipment, and may be measured using Park Systems' XE-150 equipment according to the manufacturer's manual.

The composition for semiconductor processing may have a copper corrosion inhibition index (Er, no units) of 8 to 15, represented by Equation 1 below.

$$Er = \frac{indexC \times Cab}{Ps}$$ [Equation 1]

In Equation 1, indexC is a value according to Equation 2 or Equation 2-1 below, and the value does not have unit.

In Equation 1, Cab is a content (wt %) of abrasive particles contained in an entire composition for semiconductor processing, and Ps is a content (parts by weight) of an amino silane-based compound applied to 100 parts by weight of the abrasive particles.

$$indexC = C1 \times 6 + C2 \times 5 - C3 - C4 \times 10$$ [Equation 2]

In Equation 2,

C1 is a content (parts by weight) of the amino silane-based compound applied to the abrasive particles contained in a total of 100 parts by weight of the composition for semiconductor processing, C2 is a content (parts by weight) of the azole-based compound contained in a total of 100 parts by weight of the composition for semiconductor processing, C3 is a content (parts by weight) of the copper surface protectant contained in a total of 100 parts by weight of the composition for semiconductor processing, and C4 is a content of the surfactant contained in a total of 100 parts by weight of the composition for semiconductor processing.

$$indexC = C1 \times 6 + C2 \times 5 - C3 - C4 \times 10 - C5 \times 2$$ [Equation 2-1]

In Equation 2-1,

C1 is a content (parts by weight) of the amino silane-based compound applied to the abrasive particles contained in a total of 100 parts by weight of the composition for semiconductor processing, C2 is a content (parts by weight) of the azole-based compound contained in a total of 100 parts by weight of the composition for semiconductor processing, C3 is a content (parts by weight) of the copper surface protectant contained in a total of 100 parts by weight of the composition for semiconductor processing, C4 is a content of the surfactant contained in a total of 100 parts by weight of the composition for semiconductor processing, and C5 is a content of a silicon nitride polishing enhancer contained in a total of 100 parts by weight of the composition for semiconductor processing.

The copper corrosion inhibition index (Er, no units) may be 8 to 15, 8 to 14, or 8 to 13. The composition for semiconductor processing having such a copper corrosion inhibition index obtains excellent values of a polishing rate of copper, a polishing rate of silicon nitride, and a polishing rate of silicon oxide above a certain level, and at the same time suppresses the occurrence of corrosion in copper on a surface to be polished.

The composition for semiconductor processing enables an efficient polishing process while controlling the degree of dishing, corrosion, or the like within an acceptable level.

In the composition for semiconductor processing, when polishing a substrate surface with different films, the polishing speed ratio of each film may have the following range.

The composition for semiconductor processing may be polished so that the SiO/SiN selectivity, which is a ratio of a polishing rate of the silicon oxide to a polishing rate of the silicon nitride, is 3 or more. The SiO/SiN selectivity may be 3 to 10 or 3 to 7.

The composition for semiconductor processing may be polished so that the SiO/Cu selectivity, which is a ratio of a polishing rate of the silicon oxide to a polishing rate of the copper, is 0.9 or more. The SiO/Cu selectivity may be 0.9 to 2, or 0.9 to 1.5.

The composition for semiconductor processing capable of polishing with such a polishing selectivity can provide efficient planarization when polishing the surface of an object to be polished, including all of copper, silicon oxide, and silicon nitride.

The copper polishing rate of the composition for semiconductor processing may be about 2000 Å/min to about 4600 Å/min, about 2100 Å/min to about 4000 Å/min, about 2200 Å/min to about 3800 Å/min, or about 2200 Å/min to about 3000 Å/min.

The silicon nitride polishing rate of the composition for semiconductor processing may be 300 Å/min to 2700 Å/min, 400 Å/min to about 2500 Å/min, or about 500 Å/min to about 1500 Å/min.

The silicon oxide polishing rate of the composition for semiconductor processing may be 2300 Å/min to 4400 Å/min, 2500 Å/min to about 4000 Å/min, or about 3000 Å/min to about 3700 Å/min.

When the composition for semiconductor processing according to embodiments is applied, the surface of a substrate having three different films can be efficiently etched while substantially suppressing the occurrence of dishing.

The polishing rate or the polishing rate ratio is based on the measurement under the above-mentioned polishing conditions.

The composition for semiconductor processing having the characteristics described above enables an efficient polishing process and suppresses dishing of a conductive film, which is advantageous for polishing a substrate having a through via formed therein.

Preparation of the composition for semiconductor processing of embodiments may be performed by mixing the abrasive particles and each component in a solvent such as pure water, and may include a conventional process of stirring so that the particles are well dispersed. When applying the surface-modified abrasive particles, it is possible to first surface-modify the abrasive particles and then disperse them.

Application of the composition for semiconductor processing of embodiments can be carried out by pressurizing and rotating while injecting the composition for semiconductor processing after mounting an object to be polished and a polishing pad in a substrate polishing apparatus, and the characteristics described above will be described based on measurements under the above polishing conditions. However, utilization of the composition for semiconductor processing is not limited to the polishing conditions.

Substrate Polishing Method

A method of polishing a substrate, according to an embodiment, includes preparing a platen on which a polishing pad is mounted and a carrier accommodating an object to be polished, and rotating at least one of the platen and the carrier to polish a surface of the object to be polished by a polishing surface of the polishing pad.

The polishing is performed with the composition for semiconductor processing, and the composition described above is applied as the composition for semiconductor processing.

The surface of the substrate subjected to the polishing step may be a substrate that partially includes each of copper, silicon nitride, and silicon oxide, and has a copper through via.

Since specific descriptions such as a composition for semiconductor processing, selectivity, polishing rate, dishing, and erosion overlap with the above description, the descriptions will be omitted.

Hereinafter, the present disclosure will be described in more detail through specific examples. The following examples are merely examples for facilitating the understanding of the present disclosure, and the scope of the disclosure is not limited thereto.

1. Preparation of Composition for Semiconductor Processing

With the compositions shown in Table 1 below, compositions for semiconductor processing having a pH of 2 or more and less than 4.0 were prepared.

Colloidal silica was applied as an abrasive particle, and colloidal silica prepared by a condensation reaction of tetraethyl orthosilicate (TEOS) dispersed in an ethanol solution was used. As a surface treatment agent, 3-aminopropyl triethoxy silane, which is amine-based silane, was applied, and surface-modified colloidal silica having a diameter of about 45 nm was applied as an abrasive particle.

5-aminotetrazole (ATZ) as a copper erosion inhibitor, betaine salicylate as a copper surface protectant, and a non-ionic surfactant (capstone FS-3100) including a fluorine functional group of 3 to 8 carbon atoms as a surfactant were applied. According to the preparation example, a silicon nitride polishing enhancer was added or not added. As a silicon nitride polishing enhancer, nitrilotris(methylenephosphonic acid) was applied. The remaining amount of ultrapure water was applied so that the entire composition for semiconductor processing was 100 parts by weight. Acetic acid and a KOH solution were used as pH adjusting agents. Ultrapure water was used as a solvent. The pH of the composition for semiconductor processing was measured using a hydrogen ion concentration (pH) measuring device (Laqua available from Horiba) while stirring at 200 rpm under room temperature conditions of 20° C. to 25° C. to confirm that it was within the range mentioned above.

TABLE 1

| Units (parts by weight)* | Silica content | Content of surface treatment agent (normalized) | Silicon nitride film polishing enhancer (normalized) | Copper erosion inhibitor (normalized) | Copper surface protectant (normalized) | Surfactant (normalized) |
|---|---|---|---|---|---|---|
| Example 1 | 6 | 0.009 (0.150) | 0 | 0.06 (standard) | 0.025 (0.4167) | 0.001 (0.0167) |
| Example 2 | 6 | 0.012 (0.1950) | 0 | 0.06 (standard) | 0.025 (0.4167) | 0.001 (0.0167) |
| Example 3 | 6 | 0.014 (0.2400) | 0 | 0.06 (standard) | 0.025 (0.4167) | 0.001 (0.0167) |
| Comparative Example 1 | 6 | 0.018 (0.3000) | 0 | 0.06 (standard) | 0.025 (0.4167) | 0.001 (0.0167) |
| Comparative Example 2 | 6 | 0.005 (0.0900) | 0 | 0.06 (standard) | 0.025 (0.4167) | 0.001 (0.0167) |
| Comparative Example 3 | 6 | 0.018 (0.3000) | 0.003 (0.0500) | 0.06 (standard) | 0.025 (0.4167) | 0.001 (0.0167) |
| Comparative Example 4 | 6 | 0.018 (0.3000) | 0.006 (0.1000) | 0.06 (standard) | 0.025 (0.4167) | 0.001 (0.0167) |
| Comparative Example 5 | 6 | 0.036 (0.6000) | 0.003 (0.0500) | 0.06 (standard) | 0.025 (0.4167) | 0.001 (0.0167) |

TABLE 1-continued

| Based on 100 parts by weight of silica content | — | Surface treatment agent | Silicon nitride film polishing enhancer (normalized) | Copper erosion inhibitor (normalized) | Copper surface protectant (normalized) | Surfactant (normalized) |
|---|---|---|---|---|---|---|
| Example 1 | — | 0.15000 | 0.00000 | 1.00000 | 0.41667 | 0.01667 |
| Example 2 | — | 0.19500 | 0.00000 | 1.00000 | 0.41667 | 0.01667 |
| Example 3 | — | 0.24000 | 0.00000 | 1.00000 | 0.41667 | 0.01667 |
| Comparative Example 1 | — | 0.30000 | 0.00000 | 1.00000 | 0.41667 | 0.01667 |
| Comparative Example 2 | — | 0.09000 | 0.00000 | 1.00000 | 0.41667 | 0.01667 |
| Comparative Example 3 | — | 0.30000 | 0.05000 | 1.00000 | 0.41667 | 0.01667 |
| Comparative Example 4 | — | 0.30000 | 0.10000 | 1.00000 | 0.41667 | 0.01667 |
| Comparative Example 5 | — | 0.60000 | 0.05000 | 1.00000 | 0.41667 | 0.01667 |

*The content based on 100 parts by weight of the composition is indicated, and the content displayed in the parentheses is the content calculated by converting based on 1 part by weight of the azole-based compound, which is a copper erosion inhibitor.

2. Evaluation of Physical Properties of Composition for Semiconductor Processing (1) Polishing Evaluation A copper wafer with a thickness of about 20,000 Å, a silicon nitride film wafer with a thickness of about 12,000 Å, and a silicon oxide film wafer with a thickness of about 20,000 Å were used to evaluate a polishing rate.

Each wafer was polished conventionally after mounting an HD-500 model polishing pad from SKC Solmics on a CMP device (300 mm CMP equipment from CTS) under conditions of a 3.0 psi down pressure, a carrier speed of 120 rpm, a platen speed of 117 rpm, and a slurry flow rate of 300 ml/min for 60 seconds After the polishing process, the thickness of each wafer was measured, and a polishing rate (polishing rate; A/min) for each of the copper film, silicon oxide film, and silicon nitride film of the corresponding slurry composition was calculated.

(2) Measurement of Cu Via Erosion

A test pattern wafer, which was surface-finished with SiN and a Cu via having a diameter of 5 um, was polished under the same conditions as in (1) Polishing evaluation, and then cleaned. Cleaning was performed under the condition of a brush rotation speed of 500 rpm, and chemical injection of 2000 cc/min for 60 seconds using a cleaning chemical solution prepared in-house.

The patterned wafer, having undergone the cleaning process, was subjected to Via surface analysis using Dimension ICON equipment which is BRUKER's 300 mm dedicated AFM equipment for the center, middle, and edge by the position of the wafer to obtain surface roughness values.

A scan size was about 5.0 μm, a scan speed was 0.3 Hz, and the tip was applied using BRUKER's OLTESPA-R3 model (Rectangular, Tip Radius Nom: 7 nm, max: 10 nm). Other more specific measurement conditions are shown in Table 3 below, along with surface analysis results.

(3) Evaluation of Copper Corrosion Inhibition Index (Er)

Values according to Equation 1 below were evaluated.

$$Er = \frac{indexC \times Cab}{Ps} \quad \text{[Equation 1]}$$

In Equation 1, indexC is a value according to Equation 2 or Equation 2-1 below, Cab is a content (wt %) of abrasive particles contained in an entire composition for semiconductor processing, and Ps is a content (parts by weight) of an amino silane-based compound applied to 100 parts by weight of the abrasive particles.

The indexC value, according to Equation 2, was applied when a silicon nitride polishing enhancer was included, and the indexC value, according to Equation 2-1, was applied when the silicon nitride polishing enhancer was not included.

$$\text{Index}C = C1 \times 6 + C2 \times 5 - C3 - C4 \times 10 \quad \text{[Equation 2]}$$

In Equation 2, C1 is a content (parts by weight) of the amino silane-based compound applied to the abrasive particles contained in a total of 100 parts by weight of the composition for semiconductor processing, C2 is a content (parts by weight) of the azole-based compound contained in a total of 100 parts by weight of the composition for semiconductor processing, C3 is a content (parts by weight) of the copper surface protectant contained in a total of 100 parts by weight of the composition for semiconductor processing, and C4 is a content of the surfactant contained in a total of 100 parts by weight of the composition for semiconductor processing.

$$\text{Index}C = C1 \times 6 + C2 \times 5 - C3 - C4 \times 10 - C5 \times 2 \quad \text{[Equation 2-1]}$$

In Equation 2-1,

C1 is a content (parts by weight) of the amino silane-based compound applied to the abrasive particles contained in a total of 100 parts by weight of the composition for semiconductor processing, C2 is a content (parts by weight) of the azole-based compound contained in a total of 100 parts by weight of the composition for semiconductor processing, C3 is a content (parts by weight) of the copper surface protectant contained in a total of 100 parts by weight of the composition for semiconductor processing, C4 is a content of the surfactant contained in a total of 100 parts by weight of the composition for semiconductor processing, and C5 is a content of a silicon nitride polishing enhancer contained in a total of 100 parts by weight of the composition for semiconductor processing.

TABLE 2

| | Er | Copper film polishing rate (Å/min) | Silicon nitride film polishing rate (Å/min) | Silicon oxide film polishing rate (Å/min) | Ox/Cu selectivity | Ox/SiN selectivity | Cu Via Corrosion |
|---|---|---|---|---|---|---|---|
| Example 1 | 12.8 | 2553 | 1201 | 3651 | 1.43 | 3.04 | X |
| Example 2 | 10.3 | 2314 | 772 | 3610 | 1.56 | 4.68 | X |
| Example 3 | 8.8 | 2256 | 561 | 3637 | 1.61 | 6.48 | X |
| Comparative Example 1 | 7.5 | 2318 | 251 | 3560 | 1.54 | 14.18 | ○ |
| Comparative Example 2 | 19.8 | 2366 | 753 | 2198 | 0.93 | 2.92 | Δ |
| Comparative Example 3 | 7.3 | 3126 | 651 | 3315 | 1.06 | 5.09 | Δ |
| Comparative Example 4 | 7.2 | 3548 | 703 | 3488 | 0.98 | 4.96 | Δ |
| Comparative Example 5 | 4.8 | 2847 | 630 | 2291 | 0.80 | 3.64 | Δ |

TABLE 3

| | Ra (nm) | Rmax (nm) | Skewness | Surface area difference (%) | Z Range (nm) |
|---|---|---|---|---|---|
| Example 1 | 39.4 | 156 | −0.484 | 1.57 | 157 |
| Example 2 | 39.5 | 152 | −0.386 | 1.53 | 151 |
| Example 3 | 25.8 | 150 | −0.95 | 2.45 | 150 |
| Comparative Example 1 | 35.6 | 327 | −1.49 | 2.00 | 334 |
| Comparative Example 2 | 29.5 | 364 | −2.13 | 2.33 | 364 |
| Comparative Example 3 | 28.5 | 255 | −0.83 | 2.50 | 254 |
| Comparative Example 4 | 33.4 | 571 | −3.06 | 4.55 | 571 |
| Comparative Example 5 | 30.2 | 374 | −2.5 | 2.98 | 379 |

Figure 4:
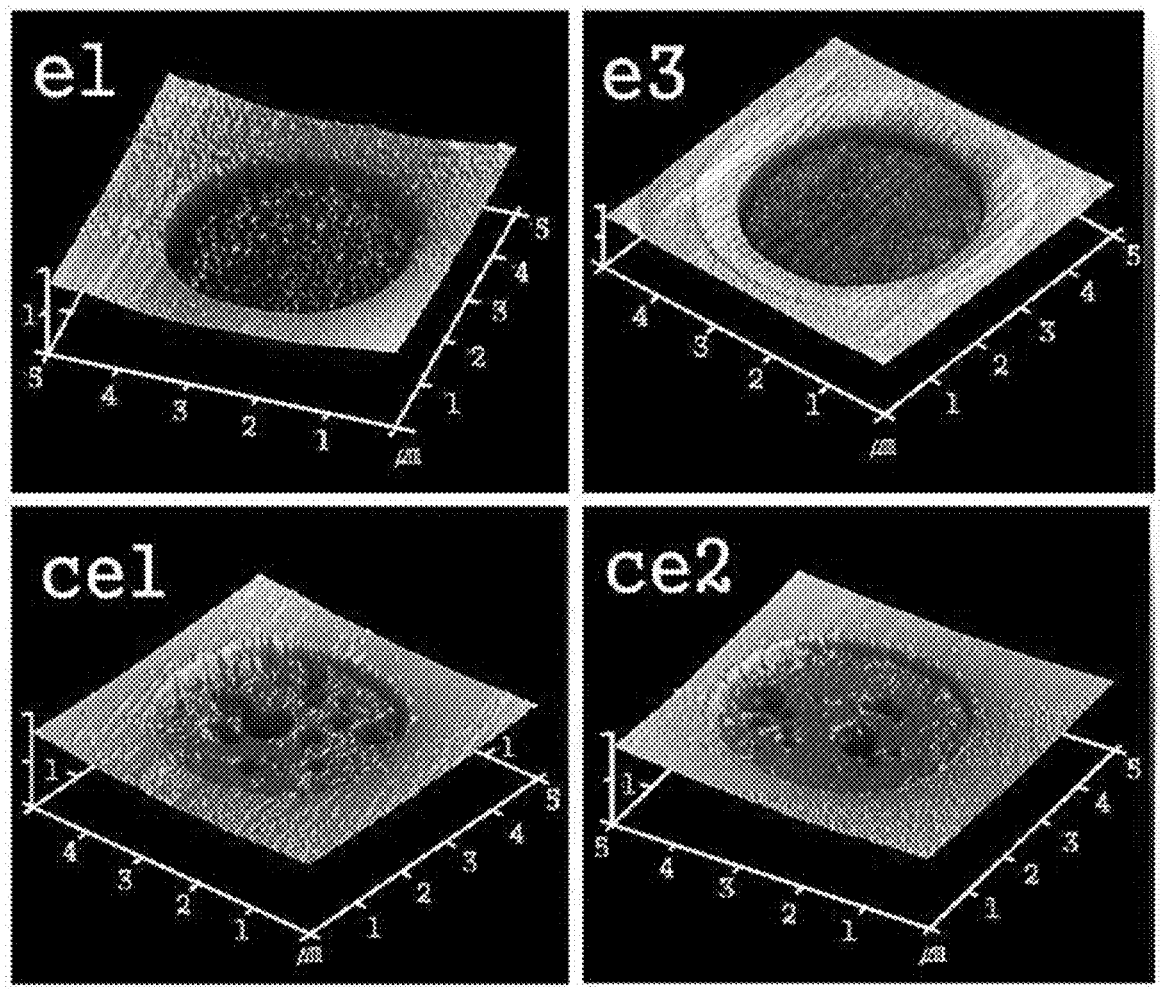
FIG. 4 is a surface atomic-force microscopy (AFM) photograph of samples manufactured in Examples and Comparative Examples, in which e1 indicates a sample of Example 1, e3 indicates a sample of Example 3, ce1 indicates a sample of Comparative Example 1, and ce2 indicates a sample of Comparative Example 2.

Scan size: 5.00 um
Scan rate: 0.300 Hz
Samples/line: 256
Lines: 256
Line direction: Retrace
Data type: Height Sensor
Aspect ratio: 1
Amplitude setpoint: 484.05 mV
Drive amplitude: 89.42 mV Referring to Tables 1 to 3 and FIG. 4, copper corrosion remarkably occurred in the Comparative Examples. Copper corrosion was clearly observed in Comparative Examples 1, 3, and 4, and in particular, edge corrosion was confirmed in Comparative Examples 2 and 4 (FIG. 4 shows Examples 1 and 3, and Comparative Examples 1 and 2). Further, in Comparative Examples 2 and 4, a decrease in the polishing rate for silicon oxide was confirmed, and in Comparative Example 1, a decrease in the polishing rate for silicon nitride was confirmed.

In the Examples, copper corrosion did not occur substantially; in particular, the surface roughness Rmax showed a great difference from the Comparative Examples. On the other hand, the Examples did not show a significant difference from the Comparative Examples in terms of Ra. In particular, Example 3 showed a somewhat lower silicon nitride film polishing rate compared to Examples 1 and 2 because a silicon nitride film polishing enhancer was not substantially applied, but Example 3 showed an excellent effect that copper corrosion practically did not occur while showing a relatively excellent copper polishing rate. The copper exposed in the via has a wider surface than the copper forming the line, and dishing or corrosion of the copper surface can greatly affect the current flow or resistance of the through via. Accordingly, it is contemplated that the composition for semiconductor processing of embodiments will be useful for polishing the surface of a substrate having a through via.

According to a composition for semiconductor processing and a method of polishing a semiconductor substrate of an embodiment, a polishing process can be performed more efficiently. In particular, when applied to the polishing process of a substrate having a through via, defects such as dishing, erosion, and protrusions can be minimized, and a flat polished surface can be realized without a thickness deviation between each film in the polishing of a surface where a plurality of different films are exposed to the outside According to a composition for semiconductor processing and a method of polishing a semiconductor substrate of an embodiment, when polishing a surface on which copper and at least one material of silicon oxide and silicon nitride are simultaneously exposed, even with a relatively high polishing rate, it is possible to realize a flat polished surface without a thickness deviation between each material.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A composition for semiconductor processing, comprising:
   abrasive particles surface-modified with an amino silane-based compound;
   a copper erosion inhibitor, including an azole-based compound;
   a copper surface protectant, including a compound having a betaine group and a salicylic group or a derivative thereof; and
   a surfactant, including fluorine in a molecule thereof,
   wherein a surface of the surface-modified abrasive particles comprises an amino silane group.

2. The composition of claim 1, wherein the azole-based compound and the copper surface protectant are included in the composition in a weight ratio of 1:0.2 to 4.

3. The composition of claim 1, wherein the azole-based compound and the surfactant are included in the composition in a weight ratio of 1:0.001 to 0.2.

4. The composition of claim 1, wherein the azole-based compound is included in the composition at 0.02 to 2 parts by weight based on 100 parts by weight of the abrasive particles.

5. The composition of claim 1, wherein the amino silane-based compound and the azole-based compound are included in the composition in a weight ratio of 1:0.1 to 0.28.

6. The composition of claim 1, wherein the composition comprises a range between 1% to 17% by weight of the abrasive particles.

7. The composition of claim 1, wherein the composition is a slurry for polishing a surface comprising copper, silicon nitride, and silicon oxide.

8. The composition of claim 7, wherein a surface of a circular via with a diameter of 5 μm, polished with the composition, has a maximum roughness of 220 nm or less as measured by atomic-force microscopy (AFM).

9. A composition for semiconductor processing, comprising:
   abrasive particles surface-modified with an amino silane-based compound;
   a copper erosion inhibitor, including an azole-based compound;
   a copper surface protectant, including a compound having a betaine group and a salicylic group or a derivative thereof; and
   a surfactant, including fluorine in a molecule thereof,
   wherein a copper corrosion inhibition index (Er) for the composition according to Equation 1 below is 8 to 15;

$$Er = \frac{indexC \times Cab}{Ps}, \qquad \text{[Equation 1]}$$

where indexC is a value according to Equation 2 below, Cab is a content (wt %) of the abrasive particles contained in an entire composition for the semiconductor processing, and Ps is a content (parts by weight) of the amino silane-based compound applied to 100 parts by weight of the abrasive particles, $$IndexC = C1 \times 6 + C2 \times 5 - C3 - C4 \times 10 \qquad \text{[Equation 2]}$$

where C1 is a content (parts by weight) of the amino silane-based compound applied to the abrasive particles contained in a total of 100 parts by weight of the composition, C2 is a content (parts by weight) of the azole-based compound contained in a total of 100 parts by weight of the composition, C3 is a content (parts by weight) of the copper surface protectant contained in a total of 100 parts by weight of the composition, and C4 is a content of the surfactant contained in a total of 100 parts by weight of the composition.

10. The composition of claim 9, further comprising a silicon nitride polishing enhancer,
    wherein the indexC is a value according to Equation 2-1 below;

$$IndexC = C1 \times 6 + C2 \times 5 - C3 - C4 \times 10 - C5 \times 2, \qquad \text{[Equation 2-1]}$$

where C1 is a content (parts by weight) of the amino silane-based compound applied to the abrasive particles contained in a total of 100 parts by weight of the composition, C2 is a content (parts by weight) of the azole-based compound contained in a total of 100 parts by weight of the composition, C3 is a content (parts by weight) of the copper surface protectant contained in a total of 100 parts by weight of the composition, C4 is a content of the surfactant contained in a total of 100 parts by weight of the composition, and C5 is a content of the silicon nitride polishing enhancer contained in a total of 100 parts by weight of the composition.

11. The composition of claim 9, wherein a surface area difference between an actual surface area and a projected surface area of a circular copper via, having a diameter of 5 μm, polished with the composition is less than 2.5% as measured by AFM.

12. The composition of claim 9, wherein the composition is used to polish a substrate by rotating either one or both of a platen on which a polishing pad is mounted and a carrier accommodating the substrate to planarize a surface of the substrate.

13. A method of polishing a substrate, comprising:
    polishing a substrate by rotating either one or both of a platen on which a polishing pad is mounted and a carrier accommodating a substrate to planarize a surface of the substrate,
    wherein the polishing is performed with a composition comprising:
       abrasive particles surface-modified with an amino silane-based compound;
       a copper erosion inhibitor, including an azole-based compound;
       a copper surface protectant, including a compound having a betaine group and a salicylic group or a derivative thereof; and
       a surfactant, including fluorine in a molecule thereof,
    wherein a surface of the surface-modified abrasive particles comprises an amino silane group, and
    the surface of the substrate includes each of copper, silicon nitride, and silicon oxide.

14. The method of claim 13, wherein an absolute value of skewness of a circular copper via having a diameter of 5 μm on the surface of the substrate subjected to the polishing is 1 or less as measured by surface atomic-force microscopy (AFM).

15. The method of claim 13, wherein a SiO/SiN selectivity, a ratio of a silicon oxide polishing rate to a silicon nitride polishing rate, is 3 or more.

16. The method of claim 13, wherein a SiO/Cu selectivity, a ratio of a silicon oxide polishing rate to a copper polishing rate, is 0.9 or more.

* * * * *